(12) United States Patent
Chen

(10) Patent No.: US 10,690,336 B1
(45) Date of Patent: Jun. 23, 2020

(54) ILLUMINATION FAN CONNECTABLE WITH AT LEAST ONE ILLUMINATION FAN FOR A COMPUTER

(71) Applicant: Chien-Hao Chen, Yilan County (TW)

(72) Inventor: Chien-Hao Chen, Yilan County (TW)

(*) Notice: Subject to any disclaimer, the term of this patent is extended or adjusted under 35 U.S.C. 154(b) by 0 days.

(21) Appl. No.: 16/403,867

(22) Filed: May 6, 2019

(30) Foreign Application Priority Data

Dec. 26, 2018 (TW) .............................. 107217659 U

(51) Int. Cl.
*H05K 7/20* (2006.01)
*F21V 33/00* (2006.01)

(52) U.S. Cl.
CPC ..... *F21V 33/0096* (2013.01); *H05K 7/20172* (2013.01)

(58) Field of Classification Search
CPC ...... F21V 33/0096; F21V 29/60; F21V 29/67; F21V 29/673; F21V 29/677; H05K 7/20172; H05K 7/20136; H05K 7/20; H05K 7/202
See application file for complete search history.

(56) References Cited

U.S. PATENT DOCUMENTS

| | | | | |
|---|---|---|---|---|
| 7,332,841 | B2 * | 2/2008 | Hsu ......................... | H02K 7/14 310/261.1 |
| 2004/0115986 | A1 * | 6/2004 | Chen ..................... | F04D 29/601 439/485 |
| 2006/0012973 | A1 * | 1/2006 | Lin ...................... | F04D 25/0613 362/96 |
| 2011/0116234 | A1 * | 5/2011 | Ye ............................ | G06F 1/20 361/695 |
| 2017/0331346 | A1 * | 11/2017 | Lai ....................... | F04D 25/0693 |
| 2019/0242688 | A1 * | 8/2019 | Huang ................. | G01D 11/245 |
| 2019/0301473 | A1 * | 10/2019 | Kato ....................... | F04D 25/08 |

\* cited by examiner

*Primary Examiner* — Bao Q Truong
(74) *Attorney, Agent, or Firm* — Muncy, Geissler, Olds & Lowe, P.C.

(57) ABSTRACT

An illumination fan connectable with at least one illumination fan for a computer includes a body, provided with a fan in center of the body, an illumination area on at least two sides of the fan at top of the body, a power socket and a first connector on one side of the body, and a second connector on another side of the body. The power socket is electrically connected with the first connector, the second connector, the fan and the illumination area. When the power socket is supplied with power, the fan and the illumination area of the body is respectively driven into rotation and illumination, and when the first connector of the body is connected with a second connector of a body of another illumination fan, a fan and an illumination area of the body of another illumination fan is respectively driven into rotation and illumination.

5 Claims, 5 Drawing Sheets

ILLUMINATION FAN CONNECTABLE WITH AT LEAST ONE ILLUMINATION FAN FOR A COMPUTER

FIELD OF THE INVENTION

The present invention relates to an illumination fan connectable with at least one illumination fan for a computer that is structurally simple and particularly suited to desktop users.

BACKGROUND OF THE INVENTION

In recent years, computing devices are making progress by leaps and bounds, and the applications of computing devices can be seen everywhere. Among these, computers have been satisfying the needs of people by providing a myriads of functions, such as executions and calculations. For example, many personal computers have taken the center stages in family lives in offering entertainments, document processing, image displaying, etc.; industrial computers provides services such as management, control and monitoring for factories; and automotive computers provides drivers and passengers with multimedia entertainments and the ability to receive information in real time. On the whole, computers have become an integral part of the human society.

Moreover, more attention has been focused on heat dissipation inside the housings of the computers with increasing demands for higher specifications of the computers. Therefore, fans are usually provided during assembly to dispel heat accumulated inside a housing to the outside. However, each fan has to be connected to the power supply through an independent power cable, so the number of fans that can be assembled is limited by the finite number of connections available on the power supply. This in turn limits the efficiency of heat dissipation. Furthermore, the additional wire inside the housing makes cable routing and managing much more cumbersome.

SUMMARY OF THE INVENTION

In view of the above shortcomings and problems, the inventor, through years of continued research and improvements in the field, has finally come up with the present invention that improves the efficiency of heat dissipation inside a computer housing unlike the structures of the prior art.

The main object of the present invention is to provide an illumination fan connectable with at least one illumination fan for a computer that is simple in structure.

In order to achieve the above and other objects, the present invention provides an illumination fan connectable with at least one illumination fan for a computer, which may include a body, provided with a fan in center of the body, an illumination area on at least two sides of the fan at top of the body, a power socket and a first connector on one side of the body, and a second connector on another side of the body, wherein the power socket is electrically connected with the first connector, the second connector, the fan and the illumination area, such that when the power socket on the one side of the body is supplied with power, the fan and the illumination area of the body can be respectively driven into rotation and illumination, and when the first connector of the body is connected with a second connector of a body of another illumination fan, a fan and an illumination area of the body of another illumination fan can be respectively driven into rotation and illumination.

In an implementation, an electrically conductive terminal is provided in the first connector, and an electrically conductive contact surface is provided in the second connector for being electrically connected with the electrically conductive terminal, such that when the first connector of the body of the illumination fan is connected with the second connector of the body of another illumination fan, the fan and the illumination area of the body of another illumination fan can be respectively driven into rotation and illumination.

In an implementation, when the body of the illumination fan is connected with the body of another illumination fan, the illumination areas of the two bodies form a continuous illumination area.

In an implementation, a groove is provided on one side of the body of the illumination fan, while an engaging block is provided on another side thereof to be engaged into the groove, such that when the groove of the body of the illumination fan is engaged with the engaging block of the body of another illumination fan, the body of the illumination fan is connected with the body of another illumination fan.

In an implementation, a groove is provided on two sides of the body of the illumination fan, and the body of the illumination fan is connected with the body of another illumination fan by respectively engaging an engaging block with one of the grooves on the sides of the body of the illumination fan and one of the grooves on the sides of the body of another illumination fan.

The foregoing features and advantages of the present invention will become more apparent from the following detailed description taken in conjunction with the accompanying drawings.

DETAILED DESCRIPTION OF THE EMBODIMENTS

Figure 1:
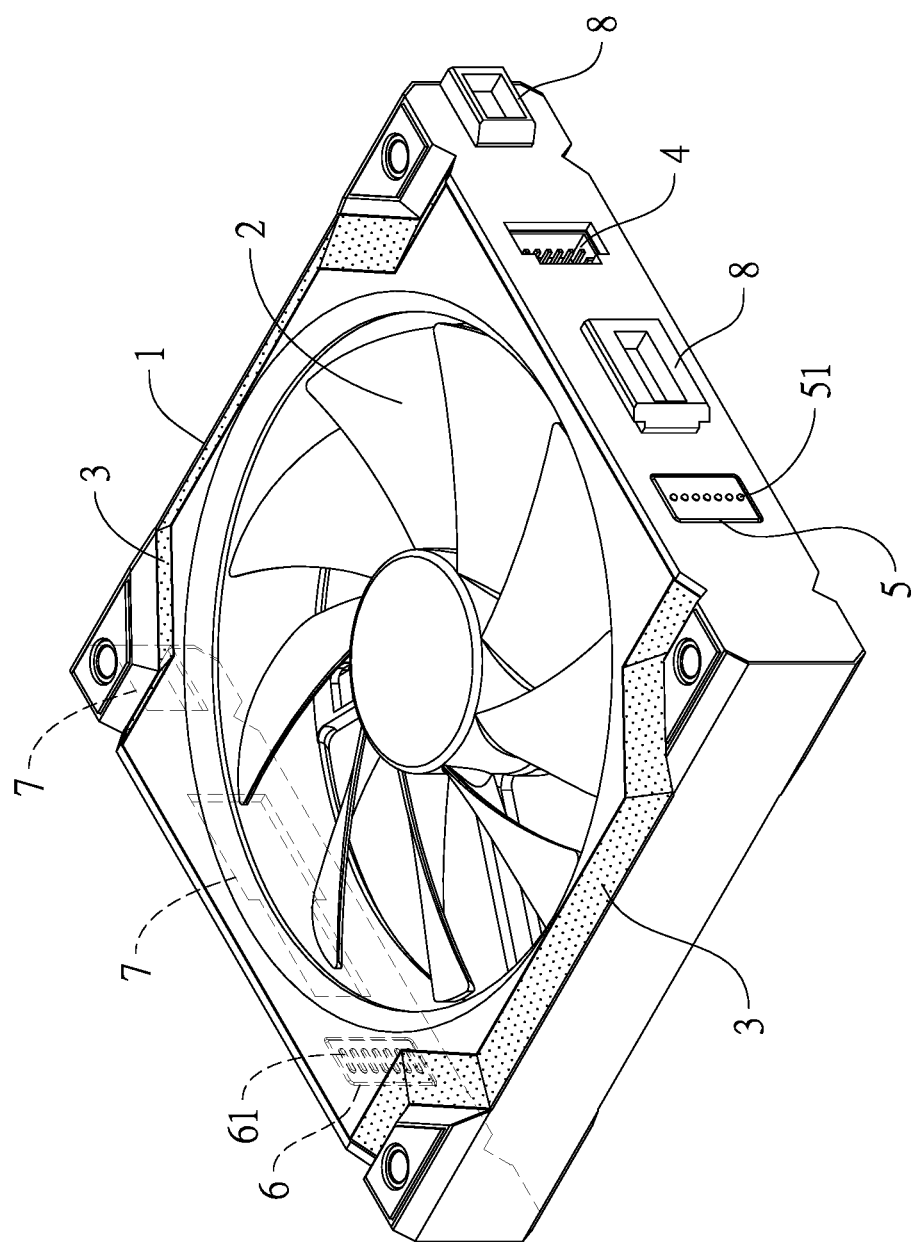
FIG. 1 is a schematic diagram depicting the outer appearance of a body in accordance with an embodiment of the present invention.
Figure 2:
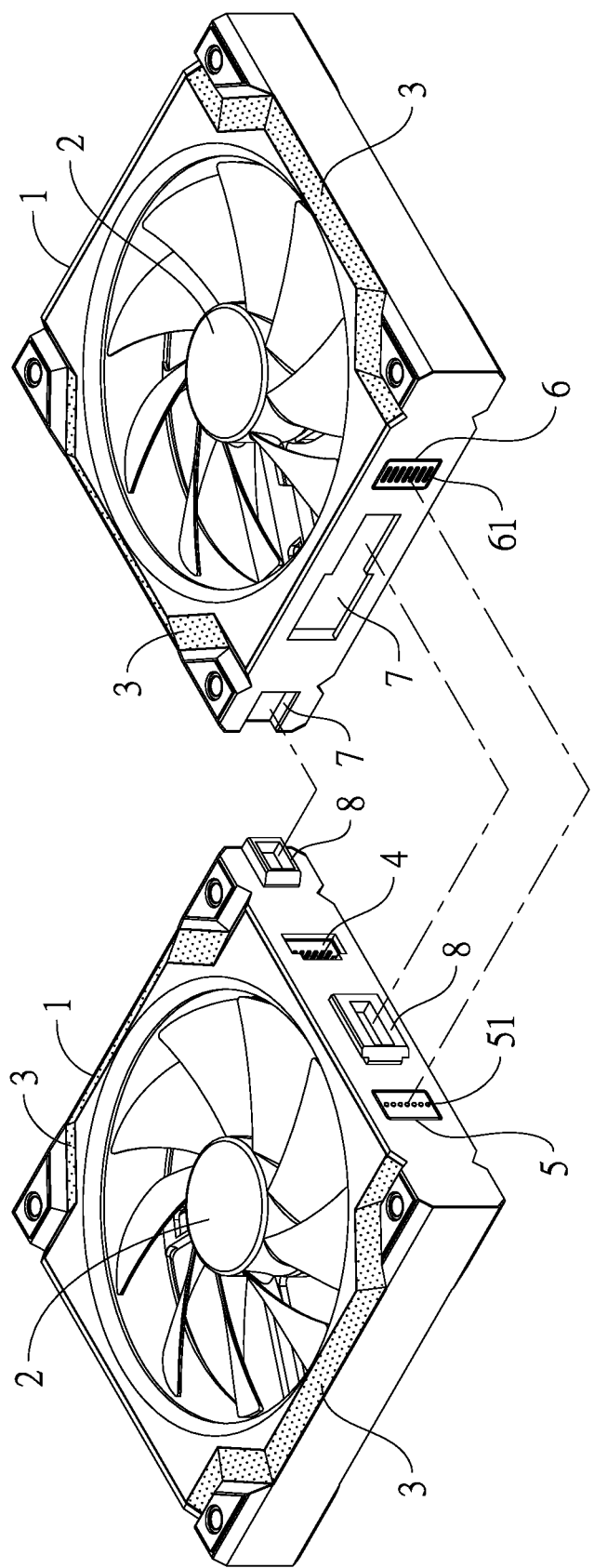
FIG. 2 is a schematic diagram depicting two bodies before being assembled in accordance with an embodiment of the present invention.
Figure 3:
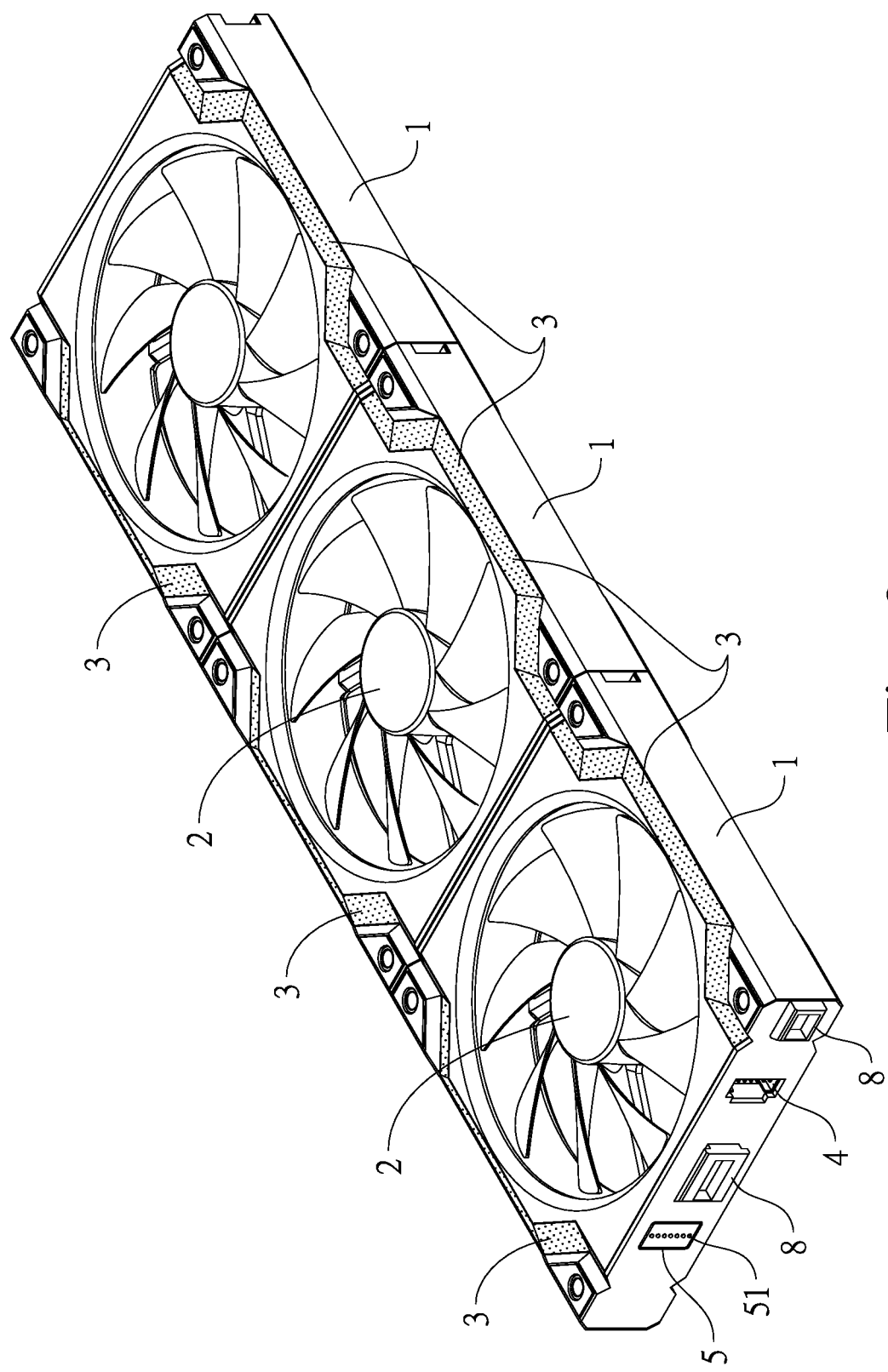
FIG. 3 is a schematic diagram depicting the outer appearance of a plurality of bodies after being assembled in accordance with an embodiment of the present invention.

Referring to FIGS. 1-3, an illumination fan connectable with at least one illumination fan for a computer in accordance with an embodiment of the present invention is provided.

The illumination fan connectable with at least one illumination fan for a computer of the present invention includes a body 1, a fan 2 disposed in the center of the body 1, an illumination area 3 disposed on at least two sides of the fan at the top of the body 1, a power socket 4 and a first connector 5 disposed on one side of the body 1, and a second connector 6 disposed on another side of the body 1. The power socket 4 is electrically connected with the first connector 5, the second connector 6, the fan 2 and the illumination area 3.

As such, once the power socket 4 at a side of the body is supplied with power, the fan 2 of the body 1 can be driven into rotation and the illumination area 3 can be illuminated.

If at least two bodies 1 are joined together to form multiple sets of fans (as shown in FIGS. 2 and 3), the first connector 5 is provided with an electrically conductive terminal 51, and the second connector 6 is provided with an electrically conductive contact face 61 to be electrically connected with the electrically conductive terminal 51, so that when the first connector 5 of a body 1 is connected to the second connector 6 of another body 1, the fan 2 of the another body 1 can be driven into rotation and the illumination area 3 can be illuminated. The illumination areas 3 of the two bodies 1 may form a continuous illumination area 3. Furthermore, a groove 7 is provided at one side of the body 1, while an engaging block 8 is provided on the other side, such that the groove 7 of one body 1 can be mated with the engaging block 8 of the other body 1, allowing the two bodies 1 to be combined together.

Figure 4:
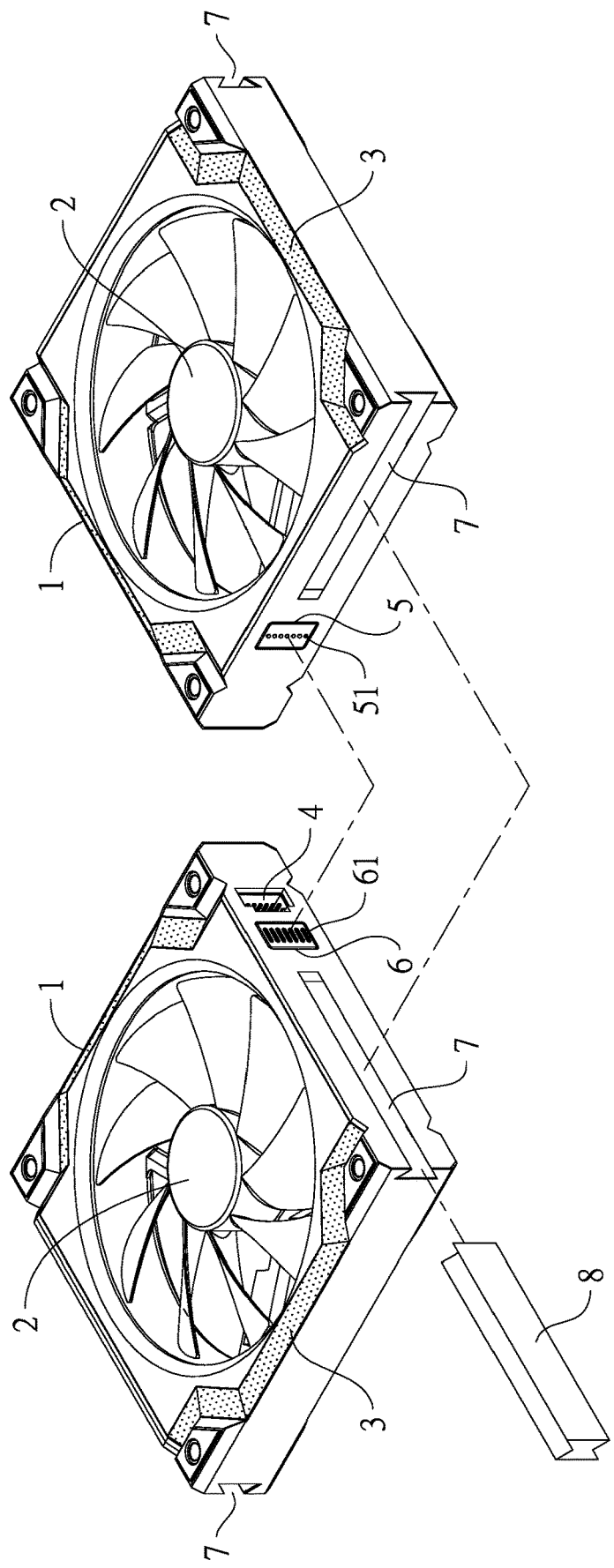
FIG. 4 is a schematic diagram depicting two bodies before being assembled in accordance with another embodiment of the present invention.
Figure 5:
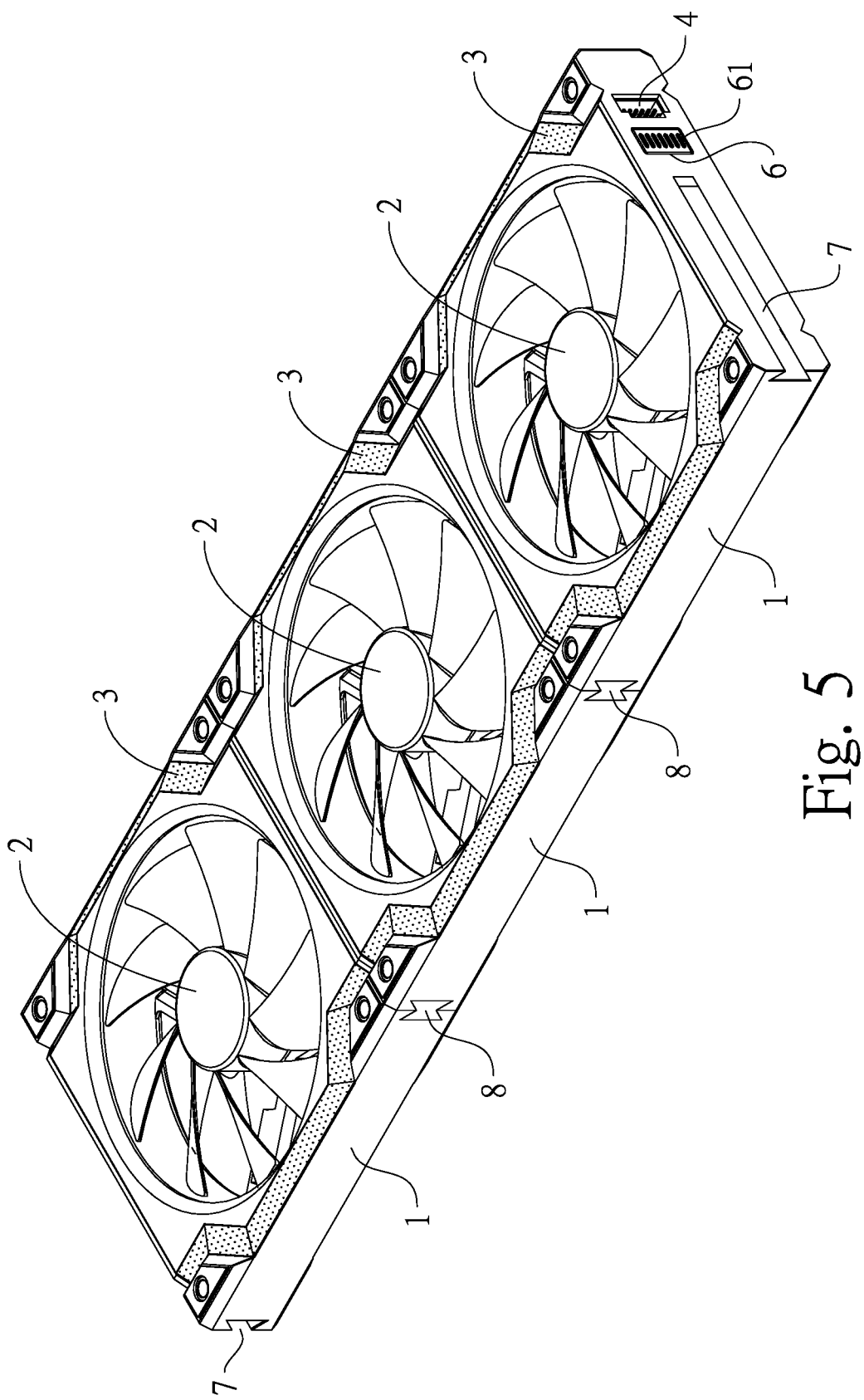
FIG. 5 is a schematic diagram depicting two bodies after being assembled in accordance with another embodiment of the present invention.

With regards to combining two bodies 1, another approach is shown in FIGS. 4 and 5, wherein grooves 7 are provided on two sides of a body 1, and an engaging block 8 is used to simultaneously engage with the grooves 7 on one side of each of two bodies 1, allowing the two bodies 1 to be combined together.

As a result, once assembled, two fans that could be independently used can be joined together, and power can be supplied by connecting the power socket of one of the bodies with a power supply of a computer to simultaneously drive the fans of the two bodies into rotation and the illumination areas into illumination. This solves the issue of insufficient power cables provided by the power supply and eliminates cumbersome routing due to large number of wires. With the combinational design of the present invention, the efficiency of heat dissipation at any location in a computer can be greatly improved.

The above descriptions provide embodiments of the present invention and the technical means employed. Various changes and modifications can be derived in light of the disclosure or teachings of the present application, and are therefore deemed as equivalents to the concepts of the present invention. The effects resulted from such changes and modifications should be construed as within the technical scope of the present invention to the extent that they do not exceed the substantive spirit covered by the present application and the drawings.

In summary, based on the disclosure above, the present invention provides an illumination fan connectable with at least one illumination fan for a computer that is simple in structure and low in cost, and thus possess practicality and industrial value, and a patent application is hereby filed in accordance with the law.

What is claimed is:

1. An illumination fan connectable with at least one illumination fan for a computer, comprising:
    a body, provided with a fan in center of the body, an illumination area on at least two sides of the fan at top of the body, a power socket and a first connector on one side of the body, and a second connector on another side of the body, wherein the power socket is electrically connected with the first connector, the second connector, the fan and the illumination area, such that when the power socket on the one side of the body is supplied with power, the fan and the illumination area of the body are respectively driven into rotation and illumination, and when the first connector of the body is connected with a second connector of a body of another illumination fan, a fan and an illumination area of the body of another illumination fan are respectively driven into rotation and illumination.

2. The illumination fan connectable with at least one illumination fan for a computer of claim 1, wherein an electrically conductive terminal is provided in the first connector, and an electrically conductive contact surface is provided in the second connector for being electrically connected with the electrically conductive terminal, such that when the first connector of the body of the illumination fan is connected with the second connector of the body of another illumination fan, the fan and the illumination area of the body of another illumination fan are respectively driven into rotation and illumination.

3. The illumination fan connectable with at least one illumination fan for a computer of claim 1, wherein when the body of the illumination fan is connected with the body of another illumination fan, the illumination areas of the two bodies form a continuous illumination area.

4. The illumination fan connectable with at least one illumination fan for a computer of claim 1, wherein a groove is provided on one side of the body of the illumination fan, while an engaging block is provided on another side thereof to be engaged into the groove, such that when the groove of the body of the illumination fan is engaged with the engaging block of the body of another illumination fan, the body of the illumination fan is connected with the body of another illumination fan.

5. The illumination fan connectable with at least one illumination fan for a computer of claim 1, wherein a groove is provided on two sides of the body of the illumination fan, and the body of the illumination fan is connected with the body of another illumination fan by respectively engaging an engaging block with one of the grooves on the sides of the body of the illumination fan and one of the grooves on the sides of the body of another illumination fan.

* * * * *